United States Patent [19]

Simons

[11] Patent Number: 5,122,428

[45] Date of Patent: * Jun. 16, 1992

[54] METHOD OF MAKING OPAQUE GRID LINES FOR THERMALLY-TRANSFERRED COLOR FILTER ARRAY ELEMENT

[75] Inventor: Michael J. Simons, Ruislip, United Kingdom

[73] Assignee: Eastman Kodak Company, Rochester, N.Y.

[ * ] Notice: The portion of the term of this patent subsequent to Dec. 31, 2008 has been disclaimed.

[21] Appl. No.: 519,612

[22] Filed: May 4, 1990

[30] Foreign Application Priority Data

May 31, 1989 [GB] United Kingdom ............... 8912488

[51] Int. Cl.$^5$ .............................................. G03C 5/00
[52] U.S. Cl. ...................................... 430/7; 430/200; 430/202; 430/203; 359/891
[58] Field of Search ..................... 430/7, 20, 200, 202, 430/203; 350/311, 330

[56] References Cited

U.S. PATENT DOCUMENTS 4,081,277 3/1978 Brault et al. ............................ 430/7
4,311,773 1/1982 Kaneko et al. ......................... 430/7

Primary Examiner—Charles L. Bowers, Jr.
Assistant Examiner—Thorl Chea
Attorney, Agent, or Firm—Harold E. Cole

[57] ABSTRACT

A process of making opaque grid lines for a color filter array element comprising
a) exposing to light through a negative grid pattern a photo-hardenable element comprising a support having thereon a coating comprising a water-soluble polymer; a water-soluble dichromate salt; and up to 1 g/m$^2$ of a black pigment, black dye or dyes providing an opaque color, or a precursor thereof;
b) washing the element with a solvent to remove the unexposed areas of the element, leaving a grid line pattern of hardened polymeric substance on the element; and
c) drying the element to produce open cells on the support divided by opaque lines of the hardened polymeric substance greater than 0.3 μm in height above the support.

In another embodiment of the invention, the above dichromate salt coating does not contain any black pigment or dye, and the grid pattern is dyed black before the drying step. Thus, a process of making opaque grid lines for a color filter array element according to another embodiment of the invention comprises
a) exposing to light through a negative grid pattern a photo-hardenable element comprising a support having thereon a coating comprising a water-soluble polymer and a water-soluble dichromate salt;
b) washing the element with a solvent to remove the unexposed areas of the element, leaving a grid line pattern of hardened polymeric substance on the element;
c) soaking the element in a solution of black dye or dyes providing a black, opaque color of sufficient concentration to provide a laydown of up to 1.0 g/m$^2$, and
d) drying the element to produce open cells on the support divided by opaque lines of the hardened polymeric substance greater than 0.3 μm in height above the support.

In another preferred embodiment, the above processes include the further steps of:
e) coating the cellular element with a polymeric dye-receiving layer; and
f) thermally transferring individual dyes to form a color filter array element comprising a repeating mosaic pattern of colorants in a polymeric binder, the pattern being made up of color patches bounded by the opaque lines in a grid pattern.

21 Claims, No Drawings

METHOD OF MAKING OPAQUE GRID LINES FOR THERMALLY-TRANSFERRED COLOR FILTER ARRAY ELEMENT

This invention relates to a method of making opaque grid lines for a thermally-transferred color filter array element which is used in various applications such as a liquid crystal display device.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271 by Brownstein entitled "Apparatus and Method For Controlling A Thermal Printer Apparatus," issued Nov. 4, 1986, the disclosure of which is hereby incorporated by reference.

Liquid crystal display devices are known for digital display in electronic calculators, clocks, household appliances, audio equipment, etc. There has been a need to incorporate a color display capability into such monochrome display devices, particularly in such applications as peripheral terminals using various kinds of equipment involving phototube display, mounted electronic display, or TV-image display. Various attempts have been made to incorporate a color display using a color filter array element into these devices. However, none of the color array elements for liquid crystal display devices so far proposed have been successful in meeting all the users needs.

One commercially-available type of color filter array element which has been used in liquid crystal display devices for color display capability is a transparent support having a gelatin layer thereon which contains dyes having the additive primary colors red, green and blue in a mosaic pattern obtained by using a photolithographic technique. To prepare such a color filter array element, a gelatin layer is sensitized, exposed to a mask for one of the colors of the mosaic pattern, developed to harden the gelatin in the exposed areas, and washed to remove the unexposed (uncrosslinked) gelatin, thus producing a pattern of gelatin which is then dyed with dye of the desired color. The element is then recoated and the above steps are repeated to obtain the other two colors. This method contains many labor-intensive steps, requires careful alignment, is time-consuming and very costly. Further details of this process are disclosed in U.S. Pat. No. 4,081,277.

In addition, a color filter array element to be used in a liquid crystal display device may have to undergo rather severe heating and treatment steps during manufacture. For example, a transparent electrode layer, such as indium tin oxide, is usually vacuum sputtered onto the color filter array element. This may take place at temperatures elevated as high as 200° C. for times which may be one hour or more. This is followed by coating with a thin alignment layer for the liquid crystals, such as a polyimide. Regardless of the alignment layer used, the surface finish of this layer in contact with the liquid crystals is very important and may require rubbing or may require curing for several hours at an elevated temperature. These treatment steps can be very harmful to many color filter array elements, especially those with a gelatin matrix.

Opaque grid lines are normally used in these color filter array elements to separate the mosaic elements or color patches from each other and to prevent color contamination or light flare.

Grid lines are made in a prior art method by evaporating onto the substrate chromium oxide through a photolithographic mask which defines the grid pattern. There is a problem with using grid lines obtained in that manner with a thermally-obtained color filter array element in that the height of such grid lines, e.g., less than 1 $\mu$m, is too small relative to the thickness of the individual elements of the color filter array. In a thermally-transferred color filter array element, the mosaic elements or color patches are about 2 $\mu$m thick, so that the grid lines will not prevent dye from wandering from one mosaic element or color patch to another. In addition, color filter array elements to be used in liquid crystal display devices are subjected to the severe heating and treatment steps described above which would further aggravate the dye-mixing problem.

It would be desirable to provide a process of making grid lines for a color filter array element obtained by thermal processing which avoids these problems. It would also be desirable to obtain a thermally-transferred color filter array element using the improved process of making grid lines.

These and other objects are achieved in accordance with this invention which comprises a process of making opaque grid lines for a color filter array element comprising a) exposing to light through a negative grid pattern a photo-hardenable element comprising a support having thereon a coating comprising a water-soluble polymer; a water-soluble dichromate salt; and up to 1 g/m² of a black pigment, black dye or dyes providing an opaque color, or a precursor thereof;

b) washing the element with a solvent to remove the unexposed areas of the element, leaving a grid line pattern of hardened polymeric substance on the element; and c) drying the element to produce open cells on the support divided by opaque lines of the hardened polymeric substance greater than 0.3 $\mu$m in height above the support.

In another embodiment of the invention, the above dichromate salt coating does not contain any black pigment or dye, and the grid pattern is dyed black before the drying step. Thus, a process of making opaque grid lines for a color filter array element according to another embodiment of the invention comprises a) exposing to light through a negative grid pattern a photo-hardenable element comprising a support having thereon a coating comprising a water-soluble polymer and a water-soluble dichromate salt;

b) washing the element with a solvent to remove the unexposed areas of the element, leaving a grid line pattern of hardened polymeric substance on the element;

c) soaking the element in a solution of black dye or dyes providing a black, opaque color of sufficient concentration to provide a laydown of up to 1.0 g/m², and d) drying the element to produce open cells on the support divided by opaque lines of the hardened polymeric substance greater than 0.3 μm in height above the support.

In a preferred embodiment of the invention, the opaque lines are about 10 μm to 60 μm in width and are separated from each other by 100 to 600 μm, the centerline distance from one mosaic element to another. In another preferred embodiment, the above processes includes the further steps of:

e) coating the cellular element with a polymeric dye-receiving layer; and f) thermally transferring individual dyes to form a color filter array element comprising a repeating mosaic pattern of colorants in a polymeric binder, the pattern being made up of color patches bounded by the opaque lines in a grid pattern.

The water-soluble polymer employed in the invention can be any such polymers known to those skilled in the art such as polyvinyl alcohol, gum arabic, gelatin, egg albumin, etc. In a preferred embodiment of the invention, the water-soluble polymer employed is gelatin. The water-soluble polymer is generally employed at a concentration of from 1-5 g/m².

Any water-soluble dichromate salt may be used in the invention such as alkali metal dichromates, e.g., potassium dichromate, sodium dichromate, lithium dichromate. etc., ammonium dichromate, zinc dichromate, etc. In a preferred embodiment, potassium dichromate is employed. The dichromate salt is present at a concentration of 10-50 weight percent of the polymer.

The black pigments or dyes employed in the invention are well known to those skilled in the art. There may be employed, for example, carbon pigments, aniline black pigments, black dyes such as nigrosine, or mixtures of dyes such as dianil brown and naphthalene blue black.

In another preferred embodiment of the invention, the black pigment or dye employed is such that the average optical density between the wavelengths of 400–700 nm of the material is at least twice the average optical density between the wavelengths between 330 and 400 nm. The lower optical density below 400 nm is preferred since it reduces the exposure to near uv radiation required to harden the polymer. A combination of the dyes Lissamine Violet AVS (ICI Ltd.), acridine orange, and Tartazine TY is an example of a dye system for this embodiment.

In another preferred embodiment of the invention, the layer contains a dye mordant to bind the dyes more strongly. Such mordants are well known to those skilled in the art and include, for example, polymers containing quaternized ammonium or pyridinium groups to mordant anionic dyes, and polymers containing sulphonate or sulphate groups to mordant cationic dyes.

The mosaic pattern in a color filter array element obtained using the process of the invention in a preferred embodiment consists of a set of red, green and blue additive primaries.

The size of the mosaic set in the thermally-transferred color filter array elements obtained by the process of the invention is not normally critical since it depends on the viewing distance. In general, the individual pixels (mosaic elements) of the set are from about 50 to about 600 μm. They do not have to be of the same size.

In a preferred embodiment of the invention, the repeating mosaic pattern of dye to form the color filter array element consists of uniform, square, linear repeating areas, with one color diagonal displacement as follows:

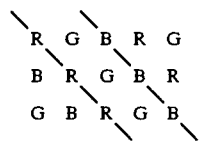

In another preferred embodiment, the above squares are approximately 100 μm on each edge.

As noted above, the color filter array elements of the invention are used in various display devices such as a liquid crystal display device. Such liquid crystal display devices are described, for example, in UK Patents 2,154,355; 2,130,781; 2,162,674 and 2,161,971.

The polymeric binder employed in the dye image-receiving layer of the invention may comprise, for example, a polycarbonate, a polyurethane, a polyester, a polyamide, a polyacrylonitrile, or mixtures or copolymers thereof, preferably those which are cross-linkable, as described in Simons Application Ser. No. 408,340, filed Sep. 18, 1989, entitled "Thermally-Transferred Color Filter Array Element". The polymeric binder may be present in any amount which is effective for the intended purpose. In general, good results have been obtained at a concentration of from about 0.25 to about 5 g/m².

A cross-linked binder which has a $T_g$ greater than 150° C. better enables the color filter array element to be resistant to the rather severe heating and treatment steps which are necessary in forming a liquid crystal display device. Examples of such cross-linkable polymeric binders include polymers which may be cross-linked by reaction with another substance present in or applied to the layer, such as epoxide resins (reacting with, for example, bifunctional amine compounds or resins, butylated urea, melamine or benzo-guanamine resins or phenolic adducts), unsaturated polyesters (reacting with, for example, organic peroxides), phenolic resins (reacting with, for example, aldehydes), alkyd resins (reacting with, for example, butylated urea, melamine or benzo-guanamine resins) or polyurethanes (reacting with, for example, di-isocyanates); and polymer systems which may be cross-linked on exposure to light, in the presence of photoinitiators or photosensitizers. Several examples of the latter class are described in "Photopolymerization of Surface Coatings" by C. G. Roffey, published by John Wiley and Sons, Chichester, England, 1982, and include as polymers, unsaturated polyesters and polyamides, polyvinyl acetals, polymers with cinnamoyl groups, epoxy resins and polyurethanes, and as photosensitizers, aromatic carbonyl compounds such as benzoin, acetophenones, benzophenones and quinones, and also aryl diazonium compounds and metal carbonyls. A valuable class of photocrosslinkable polymeric materials is described by Purbrick and Wagner in British Patent 2,106,522B, and comprises a polymer bearing nucleophilic groups, such as epoxy, carbonyl, hydroxy, tertiary amino, morpholino, unsaturated nitrogen-containing heterocyclic, or mercapto groups, and radiation-sensitive metal carbonyl compounds, such as benzene chromium tricarbonyl.

The transparent support for the color filter array element produced by the process of the invention may be any transparent material such as polycarbonate, polyethylene terephthalate, cellulose acetate, polystyrene, etc. In a preferred embodiment the support is glass.

A dye-donor element that is used to form the color filter array element of the invention comprises a support having thereon a dye layer. Any dye or mixture of dyes can be used in such a layer provided they are transferable to the dye image-receiving layer of the color array element of the invention by the action of heat. Especially good results have been obtained with sublimable dyes. Examples of sublimable dyes include anthraquinone dyes, e.g., Sumikalon Violet RS ® (product of Sumitomo Chemical Co., Ltd.), Dianix Fast Violet 3R-FS ® (product of Mitsubishi Chemical Industries, Ltd.), and Kayalon Polyol Brilliant Blue N-BGM ® and KST Black 146 ® (products of Nippon Kayaku Co., Ltd.); azo dyes such as Kayalon Polyol Brilliant Blue BM ®, Kayalon Polyol Dark Blue 2BM ®, and KST Black KR ® (products of Nippon Kayaku Co., Ltd.), Sumickaron Diazo Black 5G ® (product of Mitsui Toatsu Chemicals, Inc.); direct dyes such as Direct Dark Green B ® (product of Mitsubishi Chemical Industries, Ltd.) and Direct Brown M ® and Direct Fast Black D ® (products of Nippon Kayaku Co. Ltd.); acid dyes such as Kayanol Milling Cyanine 5R ® (product of Nippon Kayaku Co. Ltd.); basic dyes such as Sumicacryl Blue 6G ® (product of Sumitomo Chemical Co., Ltd.), and Aizen Malachite Green ® (product of Hodogaya Chemical Co., Ltd.);

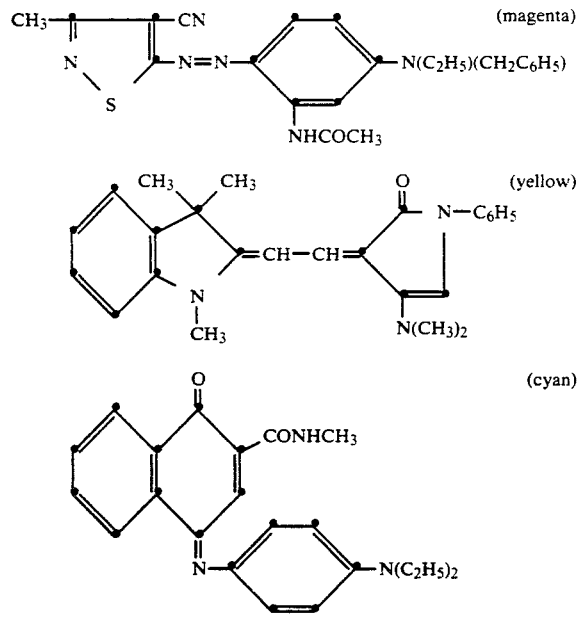

or any of the dyes disclosed in U.S. Pat. No. 4,541,830. The above subtractive dyes may be employed in various combinations to obtain the desired red, blue and green additive primary colors. The dyes may be mixed within the dye layer or transferred sequentially if coated in separate dye layers. The dyes may be used at a coverage of from about 0.05 to about 1 g/m².

The dye in the dye-donor element is preferably dispersed in a polymeric binder such as a cellulose derivative, e.g., cellulose acetate hydrogen phthalate, cellulose acetate, cellulose acetate propionate, cellulose acetate butyrate, cellulose triacetate; a polycarbonate; poly(styrene-co-acrylonitrile), a poly(sulfone) or a poly(phenylene oxide). The binder may be used at a coverage of from about 0.1 to about 5 g/m².

The dye layer of the dye-donor element may be coated on the support or printed thereon by a printing technique such as a gravure process.

Any material can be used as the support for the dye-donor element provided it is dimensionally stable and can withstand the heat of the thermal printing process. Such materials include polyesters such as poly(ethylene terephthalate); polyamides; polycarbonates; glassine paper; condenser paper; cellulose esters; fluorine polymers; polyethers; polyacetals; polyolefins; and polyimides. The support generally has a thickness of from about 2 to about 30 μm. It may also be coated with a subbing layer, if desired.

The dye-donor element of the invention may be used in sheet form or in a continuous roll or ribbon.

Various methods may be used to transfer dye from the dye donor to the transparent support to form the color filter array element of the invention. There may be used, for example, a high intensity light flash technique with a dye-donor containing an energy absorptive material such as carbon black or a non-subliming light-absorbing dye. Such a donor is used in conjunction with a mirror which has a mosaic pattern formed by etching with a photoresist material. This method is described more fully in U.S. Application Ser. No. 408,581 by Simons filed Sep. 18, 1989.

Another method of transferring dye from the dye donor to the transparent support to form the color filter array element of the invention is to use a heated embossed roller is described more fully in U.S. Application Ser. No. 408,580 by Simons filed Sep. 18, 1989.

After the dyes are transferred to the receiver, the image may be treated to further diffuse the dye into the dye-receiving layer in order stabilize the image. This may be done by radiant heating, solvent vapor, or by contact with heated rollers. The fusing step aids in preventing fading upon exposure to light and surface abrasion of the image and also tends to prevent crystallization of the dyes. Solvent vapor fusing may also be used instead of thermal fusing.

The following examples are provided to illustrate the invention.

EXAMPLE 1—GRID DYED AFTER EXPOSURE

A coating solution was made up as follows:

| Gelatin | 0.375 g |
| --- | --- |
| Potassium dichromate | 0.045 g |
| Water | 9 ml |

The solution was spread on a glass plate and dried so as to give a dry coating of about 3 μm thickness. The coating and drying were carried out under safelight conditions.

The coated surface was then contacted against a photographic negative having a two-dimensional pattern of transparent grid lines defining a pattern of opaque squares, the lines being 50 μm wide and forming a square grid of 300 μm edge length. It was then exposed through the negative grid pattern for 3 minutes to an 8 watt fluorescent ultraviolet lamp 10 cm distant. The exposed plate was then immersed in water at 40° C. and gently rocked until the unexposed areas of gelatin had been washed away, leaving a square grid pattern of raised gelatin lines forming a series of transparent shallow square cells on the glass.

The plate was then immersed in two dye solutions to dye the gelatin grid lines. First, it was immersed for one minute in a 1.0% aqueous solution of acridine orange plus 0.5% sodium bicarbonate. It was then rinsed and immersed for one minute in 1.5% aqueous crystal violet containing 0.5% sodium bicarbonate. The plate was then washed in cold water and dried. The gelatin grid lines were seen to be a purplish black in color.

EXAMPLE 2—FORMING BLACK GRID LINES

A coating solution was made up as follows:

| Gelatin | 0.375 g |
|---|---|
| Mordant* | 0.09 g |
| Lissamine Violet AVS dye (ICI Ltd.) | 0.02 g |
| Tartazine TY | 0.01 g |
| Water | 9 ml |

*Mordant was copoly[styrene(N,N-dimethyl-N-benzyl-N-3-maleimidopropyl)-ammonium]-chloride.

Coatings were made on glass plates as in Example 1.

The plate was exposed as in Example 1, except that the exposure was for 5 minutes and the distance from the ultraviolet lamp was 5 cm. It was developed by washing in water at 40° C. as in Example 1 and dried. The result was a square grid pattern of raised gelatin lines of a greenish black color, forming a series of transparent shallow square cells on the glass.

EXAMPLE 3—FORMING A COLOR FILTER ARRAY ELEMENT

A 5% solution of vinyl chloride/vinyl acetate copolymer in butanone was run over the surface of the plate and the surplus drained off, so as to form, after drying, a layer of the polymer in each of the cells forming a dye image-receiving layer.

A yellow dye-donor sheet was prepared by coating on a 6 μm poly(ethylene terephthalate) support the following composition from butanone solvent. The carbon was ball-milled in butanone prior to use.

| Yellow Composition | |
|---|---|
| Yellow dye illustrated below | 0.25 g/m² |
| Carbon Black (Regal 300 ® - Cabot Corp.) | 0.76 g/m² |
| Cellulose acetate propionate | 0.38 g/m² |
| Yellow Dye-2 | |

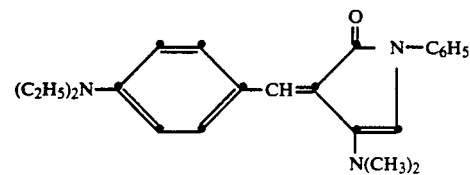

A patterned mirror was then prepared in order to provide a means to transfer dye from the dye-donor in a repeating mosaic pattern to cells of the glass plate described above.

A patterned glass mirror was made by removing the lacquer from the back of a commercially-available glass silvered mirror by treating it with a mixture of dimethyl formamide and cyclohexanone (3:1) at 95° C. for 15 minutes. The revealed metal surface was then coated with a quantity of Kodak Micro Resist 747 ® photoresist and the excess poured off so as to leave a thin film. It was then dried, exposed through a mask of the desired pattern, developed for about two minutes in Kodak Micro Resist ® developer, rinsed for 15 seconds in Kodak Micro Resist ® rinse, and then etched in a solution of 400 g/l of $FeCl_3.6H_2O$ to remove areas of the mirrored surface to give an array of transparent squares of 300 μm edge length. Each square touched the corner of the next square along one diagonal of the array, and was laterally separated from the adjacent clear squares along the orthogonal axes of the array by 600 μm.

The above-prepared yellow dye-donor sheet was placed on the grid on the glass plate, coated side down facing the grid. The patterned mirror was placed, metallized side down, on top of the donor sheet. The assembly was placed on a horizontal illuminated screen, and with the help of a 10×magnifying lens, the mirror was positioned so that its transparent windows (300 μm square) coincided with squares of the grid. The components were clamped in position, and the assembly was exposed to a flash as described below. In the transparent patterned-square areas of the mirror, the high-intensity light passed through to the dye-donor. The carbon in the dye-donor then converted the high-intensity light energy to thermal energy to selectively transfer the dye.

The 7.5×4.5 cm window of a Mecablitz ® Model 45 (Metz AG Company) was fitted with a mirror box 6 cm long to reduce the exit aperture to 4.5 cm×4.5 cm. The flash unit was placed with the window of the mirror box against the patterned glass mirror and the flash fired at full intensity. Upon separating the assembly, squares of yellow dye were seen to have transferred into one third of the squares of the opaque, black grid.

The above process was repeated using magenta and cyan donor sheets similar to the yellow donor sheet described above, but using the magenta and cyan compositions described below, the mirror and grid patterns being aligned to place the yellow, magenta and cyan dyes in adjacent squares. The plate was then heated overall to diffuse the dyes into the polymer layer, and then it was flow-coated with a 4% aqueous gelatin solution, the surplus poured off, and the plate dried.

| Magenta Composition | |
|---|---|
| Magenta dye illustrated above | 0.20 g/m² |
| Carbon Black (Regal 300 ® - Cabot Corp.) | 0.58 g/m² |
| Cellulose acetate propionate | 0.30 g/m² |
| Cyan Composition | |
| Cyan dye illustrated above | 0.39 g/m² |
| Carbon Black (Regal 300 ® - Cabot Corp.) | 1.17 g/m² |
| Cellulose acetate propionate | 0.58 g/m² |

A similar filter array element was prepared on a glass plate coated with vinyl chloride/vinyl acetate copolymer, without the grid and not being coated with gelatin, as a control.

The susceptibility of the two array elements to thermal dye migration was tested by holding them at 170° C. for 30 minutes. Microscopic examination showed the array element on the control plate without the grid to have suffered severe diffusion, with the dye patterns badly degraded. On the other hand, the array element deposited on the plate with the grid remained intact, each square of the dye remaining within its 300 μm square grid and the color mosaic being regular and well defined.

This invention has been described in detail with particular reference to preferred embodiments thereof, but it will be understood that variations and modifications can be effected within the spirit and scope of the invention.

What is claimed is:

1. A process of making a color filter array element comprising
   a) exposing to light through a negative grid pattern a photo-hardenable element comprising a support having thereon a coating comprising a water-soluble polymer; a water-soluble dichromate salt; and up to 1 g/m² of a black pigment, black dye or dyes providing an opaque color, or a precursor thereof;
   b) washing said element with a solvent to remove the unexposed areas of said element, leaving a grid line pattern of hardened polymeric substance on said element;
   c) drying said element to produce open cells on said support divided by opaque lines of said hardened polymeric substance greater than 0.3 μm in height above said support;
   d) coating said cellular element with a polymeric dye-receiving layer; and
   e) thermally transferring individual dyes to form a color filter array element comprising a repeating mosaic pattern of colorants in a polymeric binder, said pattern being made up of color patches bounded by said opaque lines in a grid pattern.

2. A process of making a color filter array element comprising
   a) exposing to light through a negative grid pattern a photo-hardenable element comprising a support having thereon a coating comprising a water-soluble polymer and a water-soluble dichromate salt;
   b) washing said element with a solvent to remove the unexposed areas of said element, leaving a grid line pattern of hardened polymeric substance on said element;
   c) soaking said element in a solution of black dye or dyes providing a black, opaque color of sufficient concentration to provide a laydown of up to 1.0 g/m²,
   d) drying said element to produce open cells on said support divided by opaque lines of said hardened polymeric substance greater than 0.3 μm in height above said support;
   e) coating said cellular element with a polymeric dye-receiving layer; and
   f) thermally transferring individual dyes to form a color filter array element comprising a repeating mosaic pattern of colorants in a polymeric binder, said pattern being made up of color patches bounded by said opaque lines in a grid pattern.

3. The process of claim 1 wherein said opaque lines are about 10 μm to 60 μm in width and are separated from each other by 100 μm to 600 μm.

4. The process of claim 2 wherein said opaque lines are about 10 μm to 60 μm in width and are separated from each other by 100 μm to 600 μm.

5. The process of claim 1 wherein said support is glass.

6. The process of claim 2 wherein said support is glass.

7. The process of claim 1 wherein said water-soluble polymer is gelatin.

8. The process of claim 2 wherein said water-soluble polymer is gelatin.

9. The process of claim 1 wherein said water-soluble dichromate salt is potassium dichromate.

10. The process of claim 2 wherein said water-soluble dichromate salt is potassium dichromate.

11. The process of claim 1 wherein said water-soluble polymer is present at a concentration of 1–5 g/m² and said dichromate salt is present at a concentration of 10–50 weight percent of said polymer.

12. The process of claim 2 wherein said water-soluble polymer is present at a concentration of 1–5 g/m² and said dichromate salt is present at a concentration of 10–50 weight percent of said polymer.

13. The process of claim 1 wherein said black pigment or dye employed is such that the average optical density between the wavelengths of 400–700 nm of the material is at least twice the average optical density between the wavelengths between 330 and 400 nm.

14. The process of claim 1 wherein said coating also contains a dye mordant.

15. The process of claim 2 wherein said coating also contains a dye mordant.

16. The process of claim 1 wherein said polymeric binder is cross-linked after transfer of said color filter array image.

17. The process of claim 2 wherein said polymeric binder is cross-linked after transfer of said color filter array image.

18. The process of claim 1 wherein said pattern consists of a set of red, green and blue additive primaries.

19. The process of claim 2 wherein said pattern consists of a set of red, green and blue additive primaries.

20. The process of claim 1 wherein said binder also contains a cross-linking agent.

21. The process of claim 2 wherein said binder also contains a cross-linking agent.

* * * * *